United States Patent
Kakuda et al.

(10) Patent No.: US 7,148,732 B2
(45) Date of Patent: Dec. 12, 2006

(54) SEMICONDUCTOR INTEGRATED CIRCUIT

(75) Inventors: Ayako Kakuda, Akishima (JP); Masamichi Fujito, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/958,466

(22) Filed: Oct. 6, 2004

(65) Prior Publication Data

US 2005/0077943 A1    Apr. 14, 2005

(30) Foreign Application Priority Data

Oct. 9, 2003    (JP) .............................. 2003-350288

(51) Int. Cl.
*H03H 11/26*    (2006.01)

(52) U.S. Cl. ..................................... 327/262; 327/378

(58) Field of Classification Search ................ 327/262, 327/263, 264, 268, 269, 270, 271, 272, 378, 327/513

See application file for complete search history.

(56) References Cited

U.S. PATENT DOCUMENTS

| | | | | |
|---|---|---|---|---|
| 5,303,191 A | * | 4/1994 | Eagan et al. ................. | 365/194 |
| 5,453,709 A | * | 9/1995 | Tanimoto et al. ........... | 327/276 |
| 6,560,164 B1 | | 5/2003 | Kawai et al. ................ | 365/233 |
| 6,803,803 B1 | * | 10/2004 | Starr et al. ................... | 327/378 |

FOREIGN PATENT DOCUMENTS

| | | |
|---|---|---|
| JP | 07-262781 | 10/1995 |
| JP | 2002-215258 | 7/2002 |

* cited by examiner

*Primary Examiner*—Linh My Nguyen
(74) *Attorney, Agent, or Firm*—Miles & Stockbridge PC

(57) ABSTRACT

A delay circuit includes a constant current source, a delay stage, and a compensating circuit. The delay circuit may compensate for a variation in a delay characteristic of the delay stage due to a variation in temperature, supply voltage and/or process.

12 Claims, 13 Drawing Sheets

SEMICONDUCTOR INTEGRATED CIRCUIT

CROSS-REFERENCE TO RELATED APPLICATION

The present application claims priority from Japanese patent application No. 2003-350288 filed on Oct. 9, 2003, the content of which is hereby incorporated by reference into this application.

BACKGROUND OF THE INVENTION

The present invention relates to a semiconductor integrated circuit having a delay circuit, and particularly to a technique for reducing dependence of a delay characteristic of the delay circuit on variations in power supply voltage and temperature and process variations, for example, a technique effective if applied to a semiconductor memory device or the like such as a flash memory which performs a read operation using a timing signal generated by the delay circuit.

SUMMARY OF THE INVENTION

A patent document 1 (Japanese Unexamined Patent Publication No. Hei 7(1995)-262781) has taken notice that when a pulse width of a signal becomes narrow under the influence of a variation in power supply voltage, a variation in temperature and process variations, an operation margin is reduced, whereas when the signal pulse width becomes large, the highest operating frequency of a circuit becomes low, and thereby has proposed, for example, a circuit which applies a potential for adjusting a delay time to a delay circuit which generates a reset signal delayed a predetermined time in a self reset circuit to thereby make the delay time constant without recourse to a power supply voltage, temperatures and variations in manufacture. In order to form a potential for adjusting a delay, the delay circuit is placed in a feedback loop, a clock signal generated by the feedback loop or its divided clock signal is phase-compared with a standard clock signal, the voltage corresponding to the difference in phase is generated by a charge pump, and an operating current of the delay circuit is negative-feedback controlled by its control voltage, thereby causing a signal pulse width to be generated to follow the cycle of the standard clock signal. Thus, the dependence of a delay characteristic of the delay circuit on the variation in power supply voltage, the variation in temperature and the process variations becomes small.

The present inventors have discussed the dependence of a delay characteristic of a delay circuit for generating a sense amplifier start timing on a variation in power supply voltage, a variation in temperature and process variations, in a flash memory (on-chip flash module) on-chipped to a microcomputer. The process variations exert an influence on the threshold voltage of a transistor. Since the dependence on the variation in power supply voltage, the variation in temperature and the process variations is large in a mere inverter delay circuit, a margin sufficient for a sense operation cannot be ensured if a delay is small, whereas if the delay is excessively large, an operating speed is reduced. The above known art needs a divider, a phase comparator and a charge pump to generate a delay time adjustment or control potential, thus causing an increase in circuit area. Further, a standard clock is needed and a crystal oscillator or the like is required to generate it, so that the number of circuit's parts increases too.

An object of the present invention is to provide a semiconductor integrated circuit equipped with a delay circuit in which dependence on a variation in power supply voltage, a variation in temperature and process variations is low.

The above, other objects and novel features of the present invention will become apparent from the description of the specification and the accompanying drawings.

Summaries of representative ones of the inventions disclosed in the present application will be explained in brief as follows:

[1] A semiconductor integrated circuit has a delay circuit. The delay circuit has a constant current source, a delay stage which determines an operation delay time of an output relative to an input, depending on a constant current produced by the constant current source, and a compensating circuit which compensates for a variation in delay characteristic of the delay stage due to a variation in temperature, a variation in power supply voltage and process variations in the opposite direction. If all semiconductor switch elements constituting the delay stage are of ideal elements which are not placed under the influence of changes or variations in temperature, power supply voltage and threshold voltage, then a delay circuit free of delay variations can be realized by using the constant current source. However, characteristics such as on resistances and threshold voltages are actually affected by the variations in temperature and power supply voltage and the process variations so that a delay characteristic varies. The compensating circuit compensates for the variation in delay characteristic in the opposite direction. That is, the compensating circuit controls a delay speed with such a current that a current characteristic with respect to the power supply voltage, temperature and threshold voltage becomes opposite to a device characteristic of each MOS transistor or the like of the delay stage. For example, a current that flows through the constant current source is set as Iconst, and a current at a constant current node is set as the sum of a current Ip and a current Id. Id indicates a current that flows through the compensating circuit. The current Ip is mirror-reflected on the delay stage as its operating current. When the on resistance and threshold voltage characteristics of the compensating circuit and delay stage vary under the influence of the variations in temperature and power supply voltage or the like, the current Id changes following it but the current Ip changes so as to cancel it. This is because Iconst=Ip+Id. As a result, the delay stage changes in its delay characteristic such that the influences such as the variations in temperature and power supply voltages at that time are canceled out, and suppresses a variation in delay time. In general, a circuit that needs a given amount of delay is configured of a delay circuit and other logic section (decode section or the like for selecting a mode or the like). A given amount of delay is often needed in total. Thus, the delay circuit is configured of MOS transistors identical to other logic section, whereby the compensating element can be adjusted such that the total delay becomes constant.

[2] As a specific form of the present invention, the delay stage can be configured of inverter type circuits wherein current control transistors whose each mutual conductance is determined depending on the constant current produced by the constant current source, and switching transistors switched in response to the input signal are arranged in series. At this time, a load transistor connected in parallel with the compensating circuit is provided at a constant current node of the constant current source. And a current that flows through the load transistor may preferably be mirror-reflected on the transistors whose each mutual conductance is determined depending on the constant current.

As a specific form of the compensating circuit, an active element which assumes a characteristic variation opposite to a variation in device characteristic of the delay stage due to the variation in temperature, the variation in power supply voltage and the process variations, may be adopted. When a change in the characteristic of each transistor placed in a path that causes a current to flow from a power supply terminal of the delay stage to its output terminal is a main factor for a variation in delay time, the active element may be intended for compensation of the current that flows from the power supply terminal of the delay stage to the output terminal. When a change in the characteristic of each transistor placed in a path that causes a current to flow from the output terminal of the delay stage to a circuit's ground terminal is of the main factor for the variation in delay time, the active element may be intended for compensation of the current that flows from the output terminal of the delay stage the circuit's ground terminal. The active element may be configured so as to be intended for compensation of the two referred to above.

The constant current does not mean a complete constant current. Quantitatively speaking, the variation in the characteristic of the constant current source due to the variation in temperature, the variation in power supply voltage and the process variations can be defined as being smaller than the variation in the characteristic of the delay stage due to the variation in temperature, the variation in power supply voltage and the process variations and smaller than the variation in the characteristic of the compensating circuit due to the variation in temperature, the variation in power supply voltage and the process variations. The need for to which extent the variation in the characteristic of the constant current source should be reduced, may be determined in consideration of a demand from the whole semiconductor integrated circuit to which the present invention is applied.

[3] As a further specific form of the present invention, the delay stage may be complementary MOS inverter type circuits in which p channel type current control MOS transistors and n channel type current control MOS transistors whose mutual conductances are determined depending on the constant current produced by the constant current source, and p channel type switching MOS transistors and n channel type switching MOS transistors switched in response to an input signal are arranged in series.

At this time, a load MOS transistor used as a current source MOS transistor for a current mirror connected in parallel with the compensating circuit is provided at a constant current node of the constant current source. A current that flows through the load transistor is mirror-reflected on the transistors which are the same conduction type as the load MOS transistor and whose each mutual conductance is determined depending on the constant current.

At this time, the compensating circuit has a compensating element connected to the constant current node of the constant current source. The compensating element is one MOS transistor identical in size to current control MOS transistors of one conduction type in each of the complementary MOS inverter type circuits. As another example, the compensating circuit has a compensating element connected to the constant current node of the constant source. The compensating element is a MOS transistors equivalently smaller in size than the current control MOS transistors of one conduction type in the complementary MOS inverter type circuit. The equivalently small-sized MOS transistors are equivalent to MOS transistors connected in series in plural form, which are identical in size to the current control MOS transistors of one conduction types in the complementary MOS inverter type circuits. As a further example, the compensating circuit comprises a current mirror circuit which supplies a mirror current to the constant current node of the constant current source. The current mirror circuit comprises p channel type MOS transistors identical in size to the p channel type current control MOS transistors in the complementary MOS inverter type circuit, and an n channel type MOS transistor identical in size to the n channel type current control MOS transistors in the complementary MOS inverter type circuit.

[4] As a specific form according to another aspect of the present invention, the delay circuit is configured as a timing generator which delays an input at the delay stage to output a timing signal. For example, a semiconductor integrated circuit has a memory equipped with the delay circuit. The memory performs a read operation using the timing signal generated by the delay circuit. As another specific form, the semiconductor integrated circuit includes the memory and a logic circuit which access-controls the memory. According to a further aspect, the delay circuit may be a ring oscillator which feeds back the output of the delay stage to the input thereof to generate a clock.

[5] In a specific form in which attention is focused on the constant current source, the constant current source has a MOS transistor of which the gate-to-source voltage is set in such a manner that the difference in current between the drain and source due to the difference in temperature becomes small. In order to set the gate-to-source voltage, a trimming register which loads trimming data therein, and a digital-to-analog converter which digital/analog-converts the trimming data loaded into the trimming register are provided. A voltage outputted from the digital-to-analog converter defines a gate voltage to be applied to the MOS transistor of the constant current source. In regard to the loading of the trimming data, a non-volatile memory area which retains trimming data, and a control circuit which reads the trimming data from the non-volatile memory area in response to a reset and loads the data into the trimming register, may be provided.

Advantageous effects obtained by a representative one of the inventions disclosed in the present application will be explained in brief as follows:

When a current that flows through a compensating circuit varies according to various conditions, a delay time of a delay stage is controlled by a current obtained by subtracting the current from a constant current given from a constant current source. Therefore, it is possible to realize a semiconductor integrated circuit equipped with a delay circuit which is reduced in dependence of a delay characteristic on a variation in power supply voltage, a variation in temperature and process variations.

If the delay circuit is used in the generation of a read timing for a memory, then it becomes easy to start up a sense amplifier with timing provided to sufficiently increase the difference (read margin) in potential between read data and a reference level. It is also possible to suppress a reduction in reading speed due to read timing being excessively late.

Thus, a circuit operating speed can be rate-controlled at a substantially constant speed, thereby making it possible to contribute to the operation of a circuit stably and at high speed. An internally-generated clock frequency can be rate-controlled substantially constant, thereby making it possible to contribute to the operation of the circuit in high performance.

In the delay circuit using the constant current source, the compensating circuit may be configured of one compensating MOS transistor. Thus, a circuit area can be reduced as compared with a circuit or the like that needs a divider, a phase comparator and a charge pump. Since a crystal oscillator or the like for generating a standard clock is also unnecessary, an increase in the number of parts can also be suppressed.

DETAILED DESCRIPTION OF THE PREFERRED EMBODIMENTS

Figure 1:
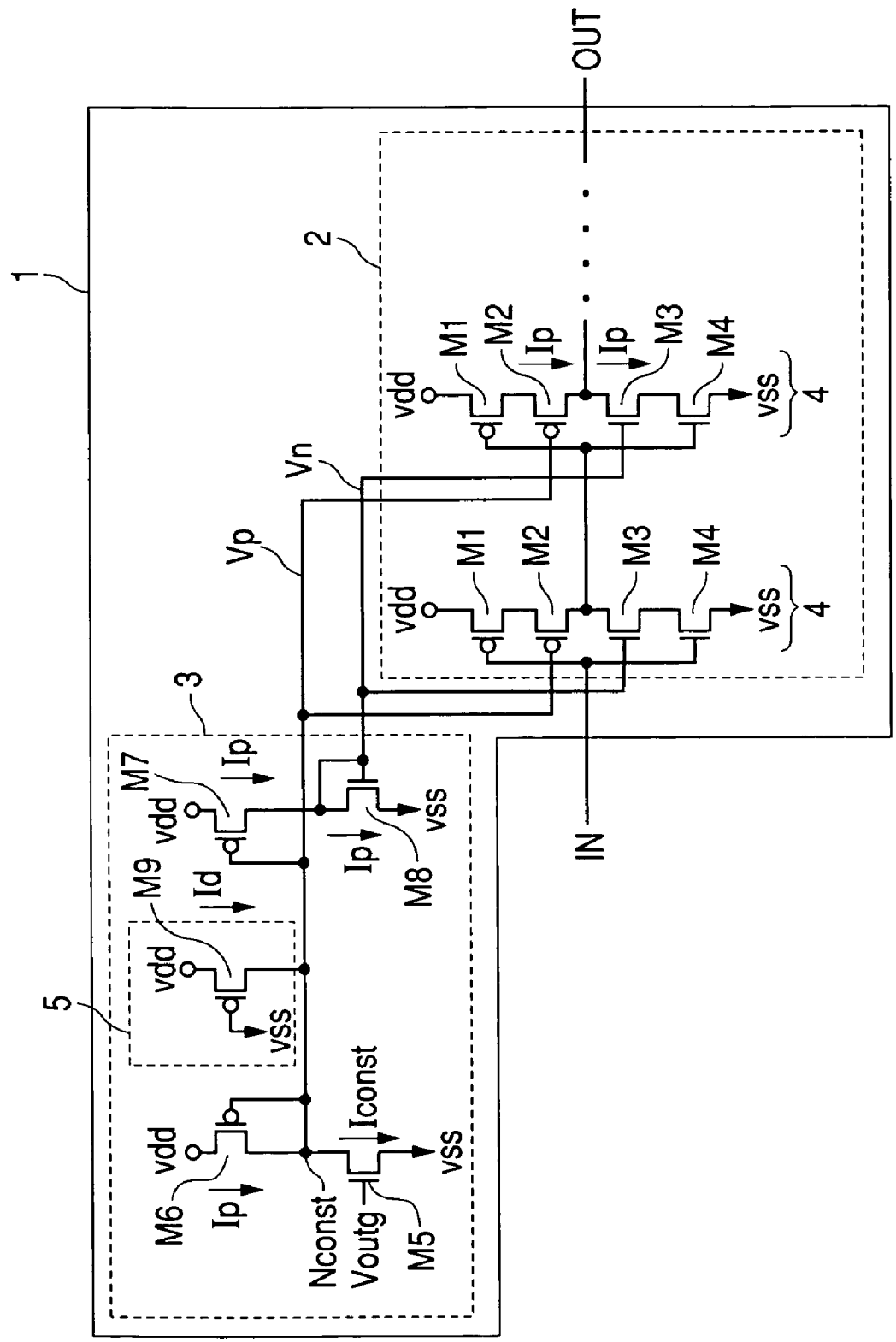
FIG. 1 is a circuit diagram showing one example of a delay circuit on-chipped to a semiconductor integrated circuit according to the present invention.
Figure 2A:
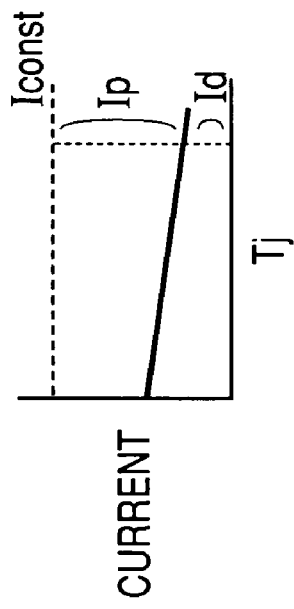
FIG. 2 is an explanatory diagram illustrating relationships among a compensating element current Id flowing through a compensating MOS transistor and operating currents Ip of CMOS inverter type circuits, with respect to respective parameters in the circuit shown in FIG. 1.
Figure 2B:
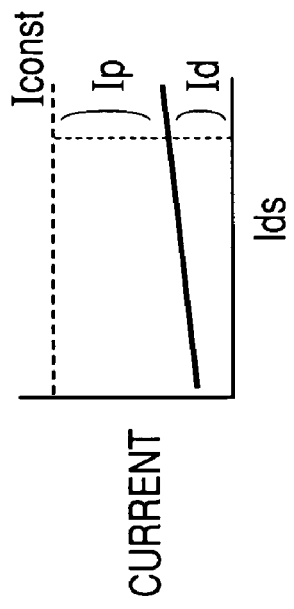
Figure 2C:
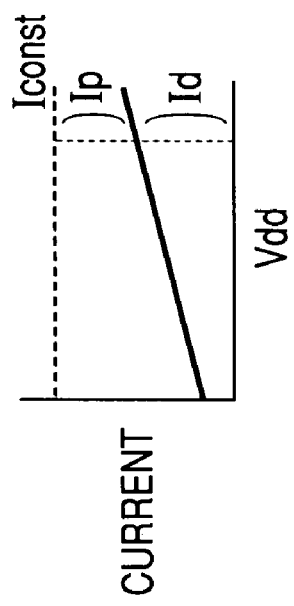
Figure 2D:
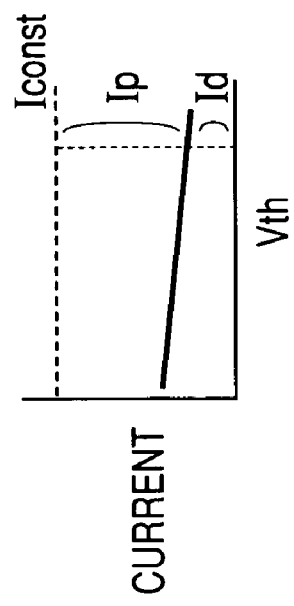

One example of a delay circuit on-chipped to a semiconductor integrated circuit according to the present invention is shown in FIG. 1. The delay circuit 1 shown in the same drawing comprises a delay stage 2 and a delay controller 3. The delay stage 2 comprises a plurality of CMOS inverter type circuits (complementary MOS inverter type circuits) 4 connected in series. Each of the CMOS inverter type circuits 4 has a configuration wherein p channel and n channel switching MOS transistors M1 and M4 are series-connected to p channel and n channel current control MOS transistors M2 and M3. The gates of the switching MOS transistors M1 and M4 of the first-stage CMOS inverter type circuit 4 are supplied with an input signal IN. Thus, the common drains of the current control MOS transistors M2 and M3 of the pre-stage inverter type circuits 4 are sequentially connected to their corresponding gates of the switching MOS transistors M1 and M4 of the next-stage inverter type circuits 4. Control voltages Vp and Vn for determining mutual conductance are applied to the respective current control MOS transistors M2 and M3 constituting the delay stage 2.

The delay controller 3 has an n channel type constant current source MOS transistor M5 that constitutes a constant current source. The drain of the n channel type constant current source MOS transistor M5 is configured as a constant current node Nconst. The constant current source MOS transistor M5 is gate-biased by a voltage Voutg to cause a constant current Iconst to flow therethrough. A p channel type MOS transistor (load MOS transistor configured as a current source MOS transistor for a current mirror) M6 whose drain and gate are short-circuited is connected to the constant current node Nconst. A drain voltage of the MOS transistor M6 is connected to the gates of the current control MOS transistors M2 as the control voltage Vp to thereby mirror-reflect a current Ip flowing through the MOS transistor M6 on the current control MOS transistors M2. In order to produce the control voltage Vn, there are provided a p channel type MOS transistor M7 whose gate is connected to the constant current node Nconst, and an n channel type MOS transistor (current source MOS transistor for current mirror) M8 connected in series with the p channel type MOS transistor M7 and whose gate and drain are short-circuited. A drain voltage of the MOS transistor M8 is connected to the gates of the current control MOS transistors M3 as the control voltage Vn so that a current Ip flowing through the MOS transistors M7 and M8 is mirror-reflected on the current control MOS transistor M3. A p channel type compensating MOS transistor M9 held in an on state is provided between the constant current node Nconst and a power supply terminal Vdd as one example of a compensating circuit 5. The compensating MOS transistor M9 has a gate connected to a circuit's ground voltage VSS and is always held on. Element constants of the p channel type and n channel type MOS transistors M5 through M9 that constitute the delay controller 3 are made identical to element constants of p channel type and n channel type MOS transistors constituting a logic section as typified by the MOS transistors M1 through M4 of the delay stage 2.

A current Id that flows through the compensating MOS transistor M9 depends on the power supply voltage (Vdd), temperature (Ti) and threshold voltage (Vth) of each MOS transistor. The threshold voltage principally varies according to process variations. The current Ip that flows through the MOS transistor M6 is expressed in an equation of Ip=Iconst−Id. The current Ip is mirror-reflected on the MOS transistors M7 and M2 by a current mirror circuit. The current Ip that flows through the MOS transistor M8 is also mirror-reflected on the MOS transistors M3 by the current mirror circuit. When a variation in the power supply voltage and a variation in temperature or the like occur, the characteristic of the MOS transistor M9 changes and the current Id changes correspondingly. Although the characteristics of the MOS transistors constituting the delay stage 2 are also intended to change in a similar manner at this time, the current Ip changes in the direction to cancel it in response to the change in the current Id. In brief, when the on resistances of the MOS transistors constituting the delay stage 2 and the like are intended to change due to the variation in temperature or the like, the on resistances of the MOS transistors M2 and M3 are dynamically varied so as to cancel out influences produced due to the changes in the on resistances. Relationships among the compensating element current Id flowing through the compensating MOS transistor and the operating currents Ip of the CMOS inverter type circuits, with respect to respective parameters in the circuit shown in FIG. 1 are illustrated in FIG. 2, for example. As the power supply voltage Vdd becomes high, the compensating element current Id increases and the operating currents Ip decrease. As the temperature Ti becomes high, the compensating element current Id decreases and the operating currents Ip increase. As the threshold voltage Vth becomes low, the compensating element current Id decreases and the operating currents Ip increase. As a drain-to-source saturation current Ids becomes large, the compensating element current Id increases and the operating currents Ip decrease.

Thus, the delay stage 2 changes in its delay characteristic in such a manner that the influences such as the changes in the temperature and power supply voltage at the above time are canceled out, and is subjected to suppression of a variation in delay time. In general, a circuit that needs a given amount of delay is configured of a delay circuit and other logic section (decode section for selecting a mode or the like, or the like). A given amount of delay is often needed in total. Thus, the delay circuit 1 is configured of MOS transistors identical to other logic section, whereby the characteristic of the compensating MOS transistor can also be adjusted such that the total delay becomes constant.

Since the compensating MOS transistor M9 is of the p channel type as is apparent from the circuit configuration shown in FIG. 1, the current Id that flows through the compensating MOS transistor M9 depends on device characteristics such as the threshold voltage of each p channel type MOS transistor, etc. and does not depend on a device characteristic of each n channel type MOS transistor. In brief, the compensating MOS transistor M9 is ranked as a countermeasure suitable for the case in which a variation in device characteristic due to the power supply voltage, temperature and process variations noticeably occurs in each of the p channel type MOS transistors as compared with the n channel type MOS transistors.

Figure 3:
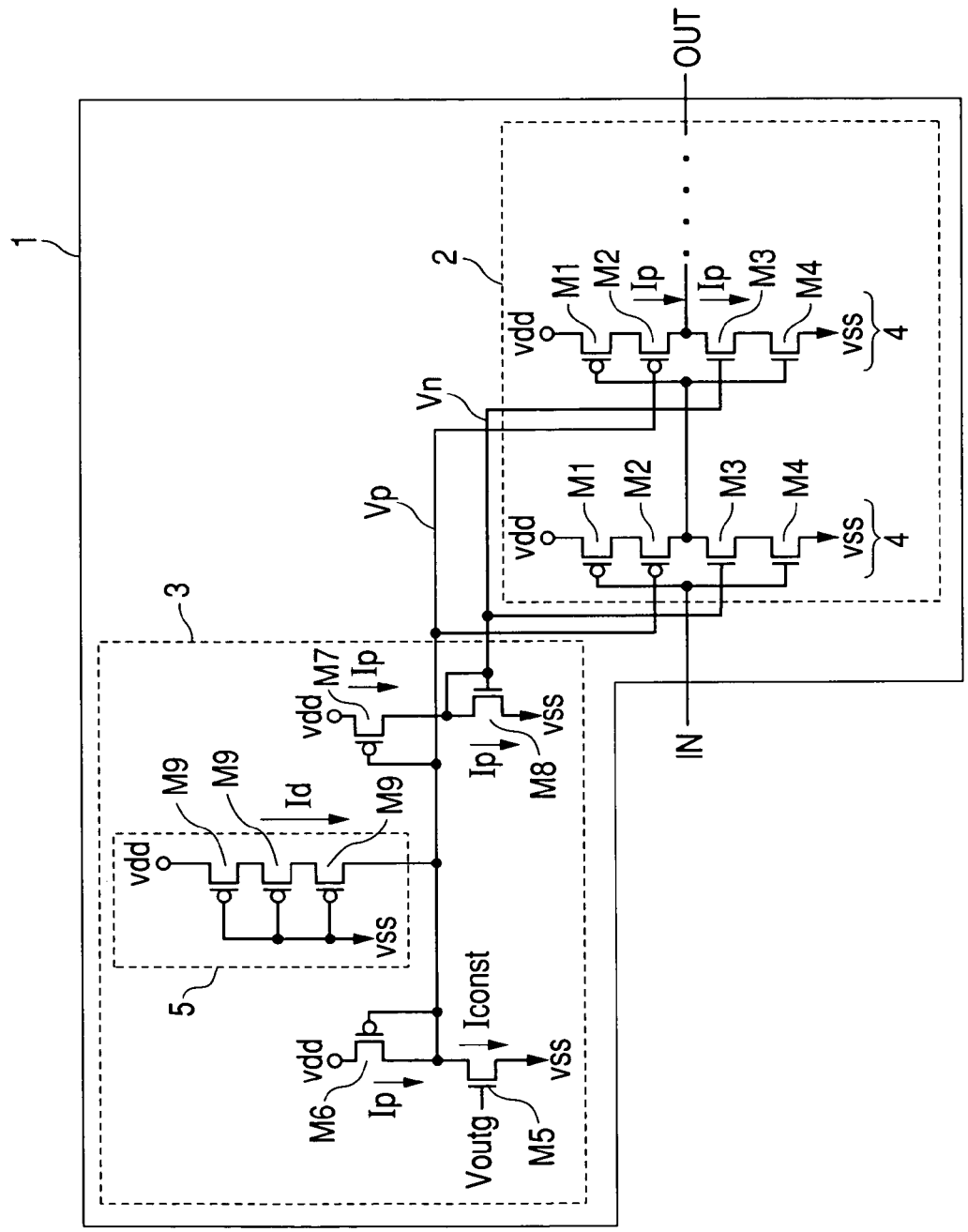
FIG. 3 is a circuit diagram showing another example of the delay circuit on-chipped to the semiconductor integrated circuit according to the present invention, which is equipped with a compensating circuit in which three compensating MOS transistors are connected in series.

Another example of the delay circuit on-chipped to the semiconductor integrated circuit according to the present invention is shown in FIG. 3. The present example is different from the example shown in FIG. 1 in that a compensating circuit 5 comprises three p channel type compensating MOS transistors M9 connected in series. According to the circuit shown in FIG. 3, a current Id that flows through the compensating circuit 5 becomes smaller than one shown in FIG. 1. The present circuit aims to proactively avoid the fact that when the current supply capacity of the compensating circuit 5 becomes excessively large, an increase or decrease in current Ip becomes sharp due to a large change in current Id so that control is hard to converge. A compensating MOS transistor small in gate width may be adopted. Since the compensation is aimed to fine-adjust circuit characteristics, it normally corresponds to Ip>Id. In the actual circuit, compensating MOS transistors connected in series or a compensating MOS transistor small in gate width may be used.

Figure 4:
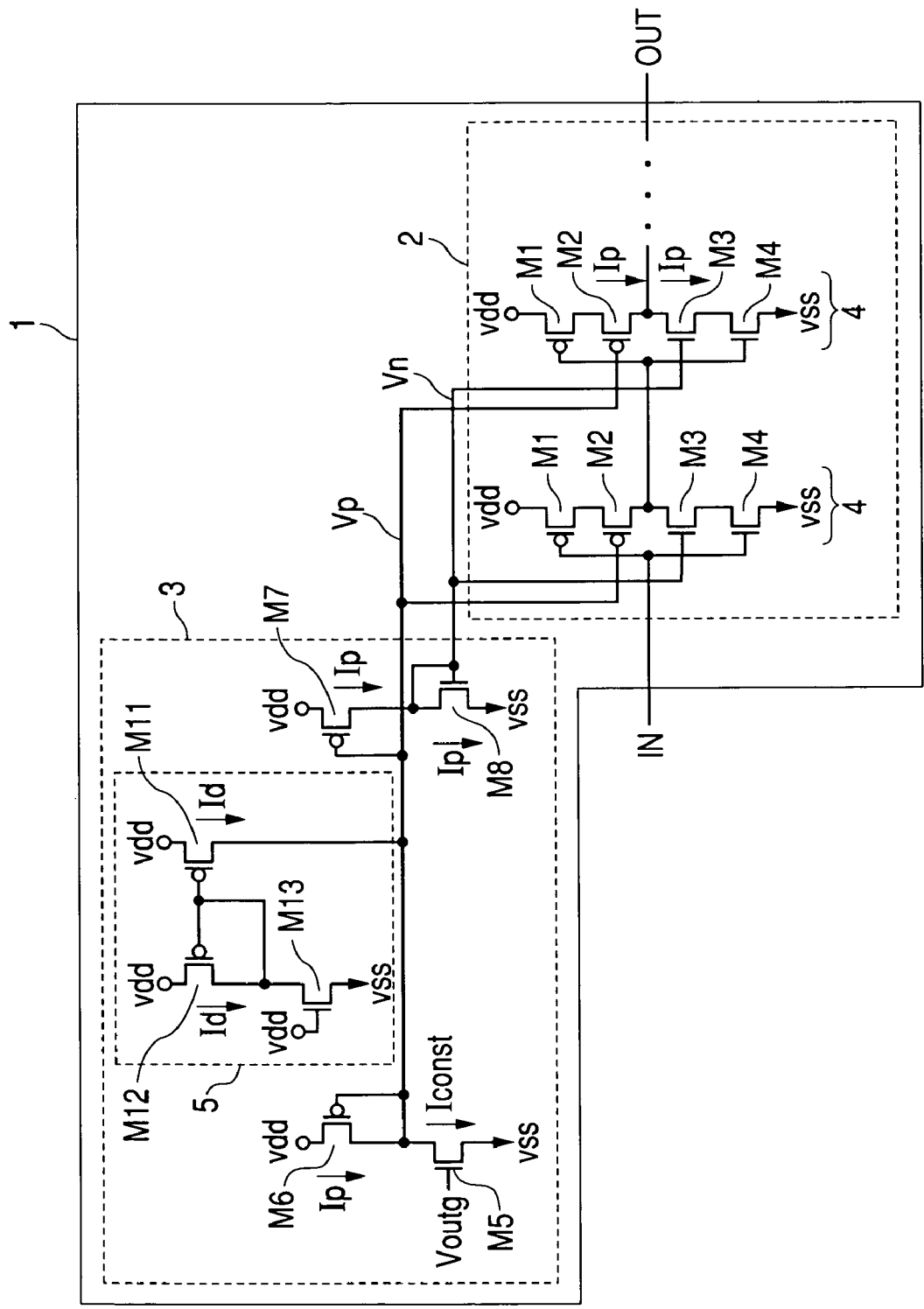
FIG. 4 is a circuit diagram showing a further example of the delay circuit on-chipped to the semiconductor integrated circuit according to the present invention, wherein a compensating circuit comprises a current mirror circuit that supplies a mirror current to a constant current node of a constant current source.

A further example of the delay circuit on-chipped to the semiconductor integrated circuit according to the present invention is shown in FIG. 4. The present example is different from the example shown in FIG. 1 in that a compensating circuit 5 comprises a current mirror circuit that supplies a mirror current to the constant current node Nconst of the constant current source. The current mirror circuit constituting the compensating circuit 5 comprises p channel type MOS transistors M11 and M12 identical in size to the p channel type current control MOS transistors M1 and M2 of each of the CMOS inverter type circuits 4, and an n channel type MOS transistor M13 identical in size to the n channel type current control MOS transistors M3 and M4 of each of the CMOS inverter type circuits 4. A compensating element is of the n channel type MOS transistor M13. A current Id that flows through the compensating MOS transistor M13 depends on the threshold voltages of the n channel type MOS transistors M3 and M4 of the CMOS inverter type circuit 4 and does not depend on the threshold voltages of the p channel type MOS transistors M1 and M2 of the same circuit 4. In brief, the compensating circuit 5 shown in FIG. 4 is ranked as a countermeasure suitable for the case in which a variation in device characteristic due to a power supply voltage, temperature and process variations noticeably occurs in each of the n channel type MOS transistors as compared with the p channel type MOS transistors.

With the connection of the compensating circuit 5 shown in FIG. 1 or 3 and the compensating circuit 5 shown in FIG. 4 in parallel with each other, although not shown in the drawing in particular, the currents Id that flow through both compensating circuits as a whole depend on both of the threshold voltages of the p channel type MOS transistors M1 and M2 and the threshold voltages of the n channel type MOS transistors M3 and M4. Thus, even if, in this case, the variation in device characteristic due to the power supply voltage, temperature and process variations noticeably occurs in any of MOS transistors of p and n channel types, such a configuration can adapt to it.

Figure 5:
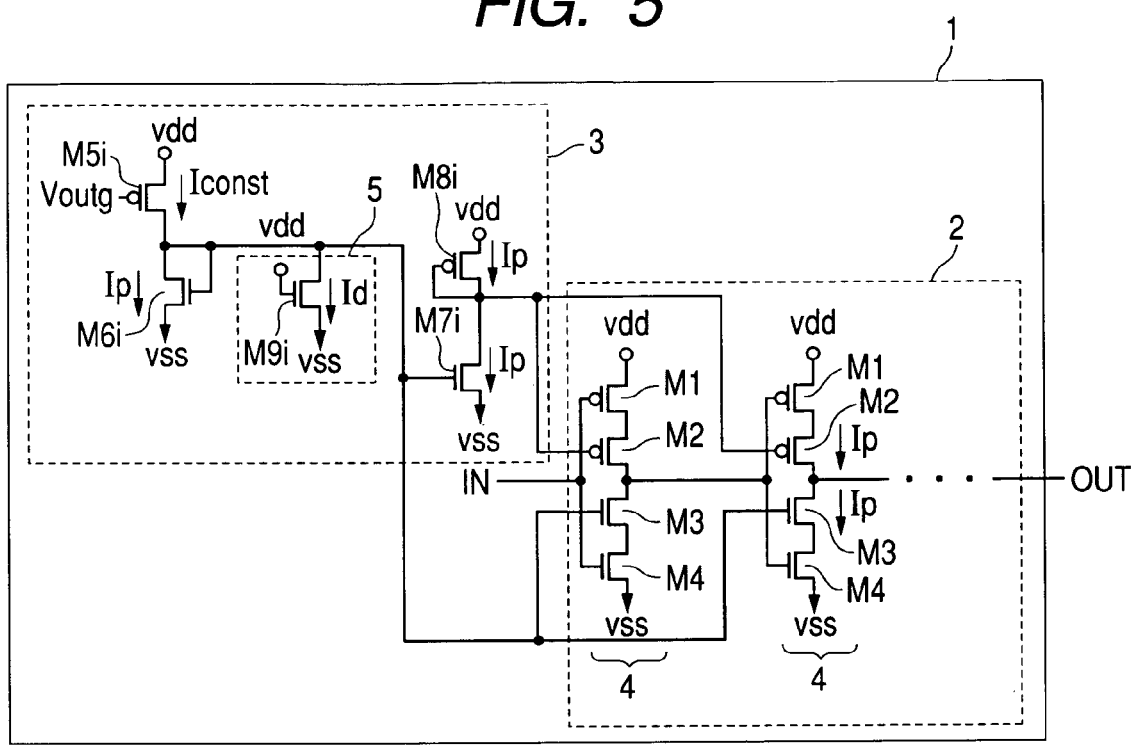
FIG. 5 is a circuit diagram depicting yet another example of the delay circuit on-chipped to the semiconductor integrated circuit according to the present invention, wherein the exchange of functions based on n channel and p channel type MOS transistors is effected on a delay control circuit shown in FIG. 1.

Yet another example of the delay circuit on-chipped to the semiconductor integrated circuit according to the present invention is shown in FIG. 5. Such a configuration as shown in the same drawing differs from the configuration of the delay controller 3 shown in FIG. 1 in that the conduction types of the MOS transistors constituting it are changed from the n channel type to the p channel type and from the p channel type to the n channel type. A constant current source comprises a p channel type MOS transistor M5i. A compensating circuit comprises an n channel type MOS transistor M9i. Such a circuit configuration is suitable for a case in which a variation in device characteristic due to a power supply voltage, temperature and process variations noticeably occurs in each of the n channel type MOS transistors as compared with the p channel type MOS transistors. Since only the n channel type MOS transistor M9i is used for a compensating element, the present configuration is reduced in circuit area as compared with the configuration of FIG. 1.

Figure 6:
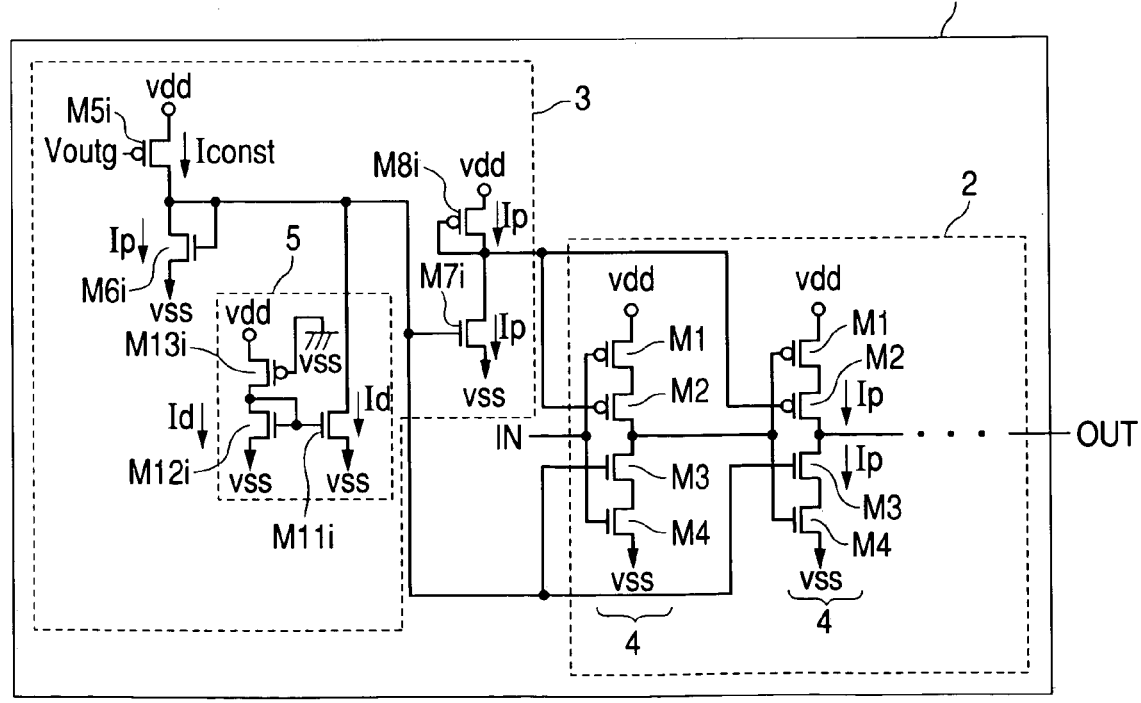
FIG. 6 is a circuit diagram showing a still further example of the delay circuit on-chipped to the semiconductor integrated circuit according to the present invention, wherein the exchange of functions based on n channel and p channel type MOS transistors is effected on a delay control circuit shown in FIG. 4.

A still further example of the delay circuit on-chipped to the semiconductor integrated circuit according to the present invention is shown in FIG. 6. Such a configuration as shown in the same drawing is different from the configuration of the delay controller 3 of FIG. 4 in that the conduction types of the MOS transistors constituting it are changed from the n channel type to the p channel type and from the p channel type to the n channel type. A constant current source comprises a p channel type MOS transistor M5i. A compensating element comprises a p channel type MOS transistor M13i. Such a circuit configuration is suitable for a case in which a variation in device characteristic due to a power supply voltage, temperature and process variations noticeably occurs in each of the p channel type MOS transistors as compared with the n channel type MOS transistors.

Figure 7:
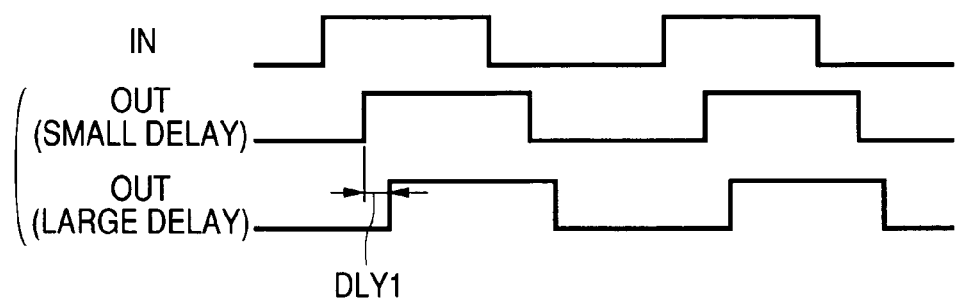
FIG. 7 is a timing chart illustrating delay variations in output OUT of each of the delay circuits described based on FIGS. 1 through 6 with respect to an input IN thereof.
Figure 8:
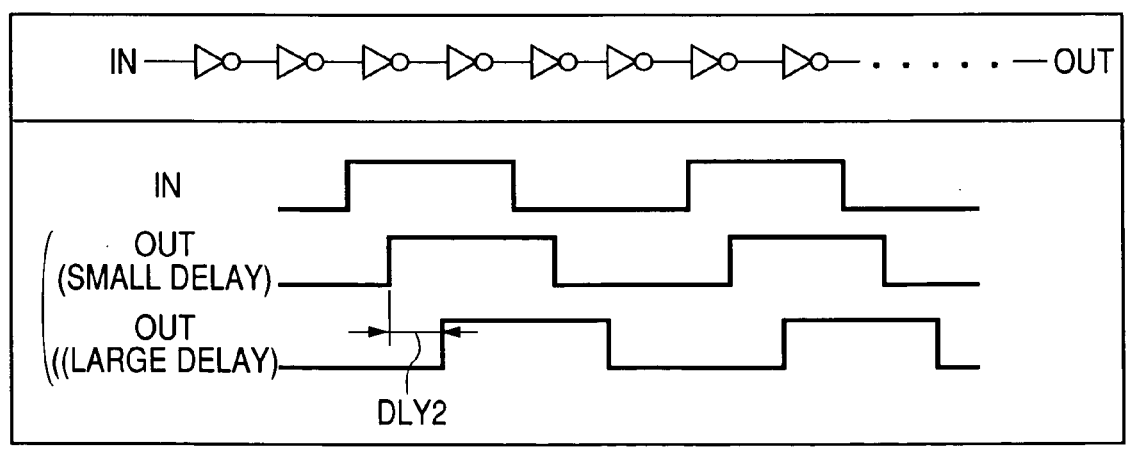
FIG. 8 is an explanatory diagram illustrating an inverter series delay circuit according to a comparative example of the present invention, and delay variations in output OUT thereof with respect to an input IN thereof.
Figure 9:
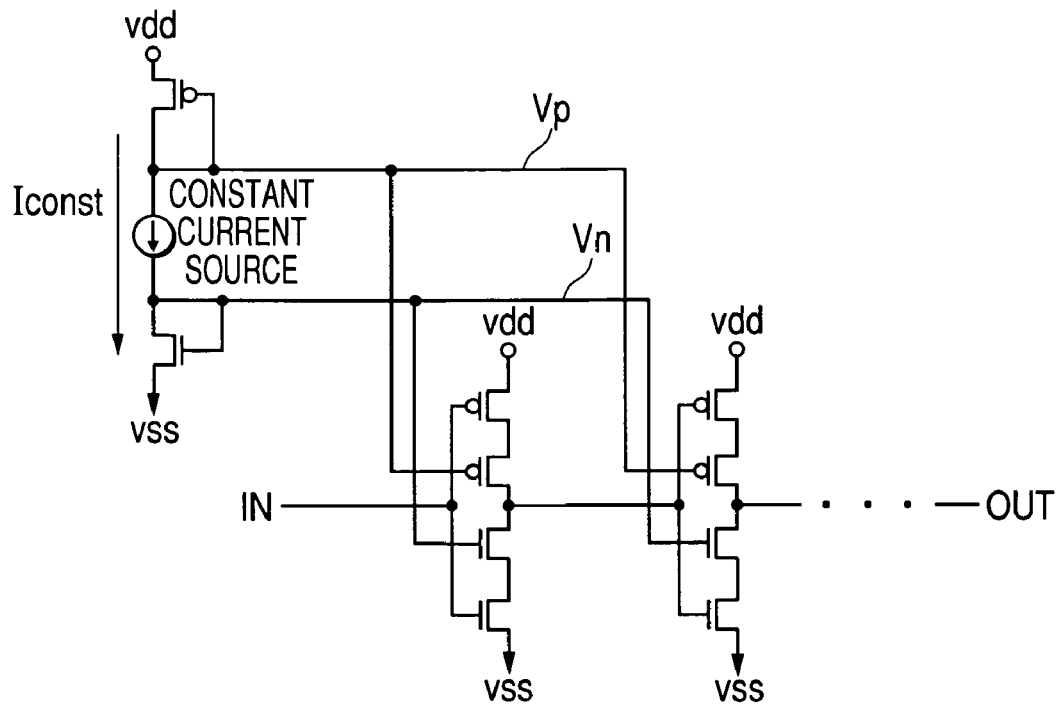
FIG. 9 is a circuit diagram showing a comparative example wherein a delay time is controlled by a constant current of a constant current source and no compensating circuit is adopted.

According to the delay circuits 1 described based on FIGS. 1 through 6, a delay variation in output OUT relative to an input IN as illustrated in FIG. 7 is relatively small as indicated by DLY1 with respect to the variation in power supply voltage, the variation in temperature and the process variations. In the case of a delay circuit which determines a delay time by the number of series stages of inverters as in a comparative example of FIG. 8, a delay variation in output OUT relative to an input IN is relatively large as indicated by DLY2. When a delay time is controlled by a constant current of a constant current source and no compensating circuit is adopted as in a comparative example of FIG. 9, a delay variation in output OUT relative to an input IN is not reduced to FIG. 7 although it becomes smaller than one shown in FIG. 8.

Figure 10:
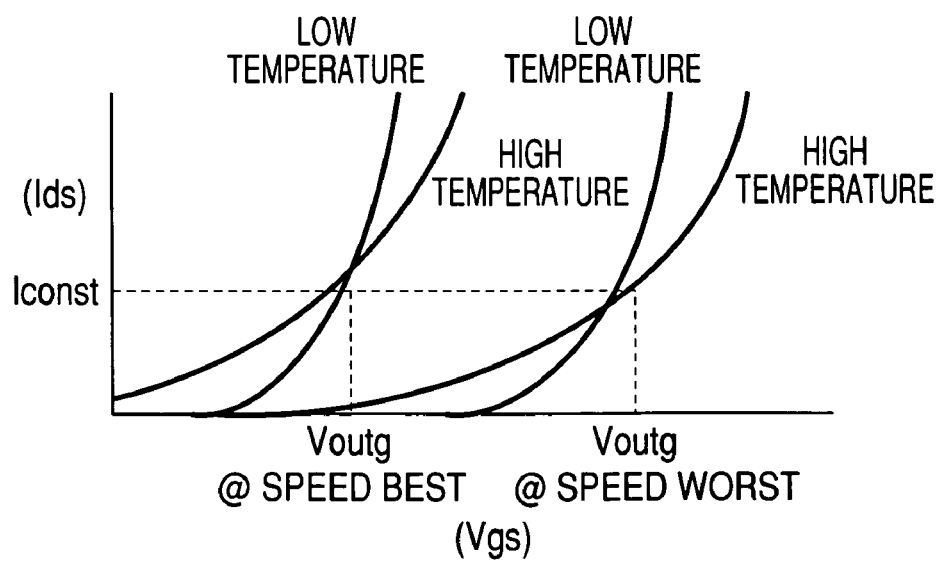
FIG. 10 is an explanatory diagram showing the principle of a constant current source.

The principle of the constant current source is shown in FIG. 10. In the constant current source MOS transistor M5, the gate-to-source voltage (Vg) is set in such a manner that the difference in current between the drain and source (Ids) due to the difference in temperature becomes small. That is, as shown in the same drawing, such temperature intersecting points that the drain-to-source currents relative to the threshold voltages become identical substantially, exist under various temperatures typified by low and high temperatures. When the voltages lying in the neighborhood of the temperature intersecting points are set as gate voltages Voutg, it is possible to cause a constant current to flow into the constant current source MOS transistor M5 under the various temperatures without depending on the temperatures. Adjusting (trimming) the gate voltages Voutg every semiconductor integrated circuits to which the delay circuits are on-chipped makes it possible to cause the constant current to flow without relying on process variations. Thus, it is possible to obtain a constant current Iconst which does not depend on the power supply voltage, temperatures and threshold voltages. Although not shown in the drawing in particular, the p channel type current source MOS transistor M5i is also similar to the above.

Figure 11:
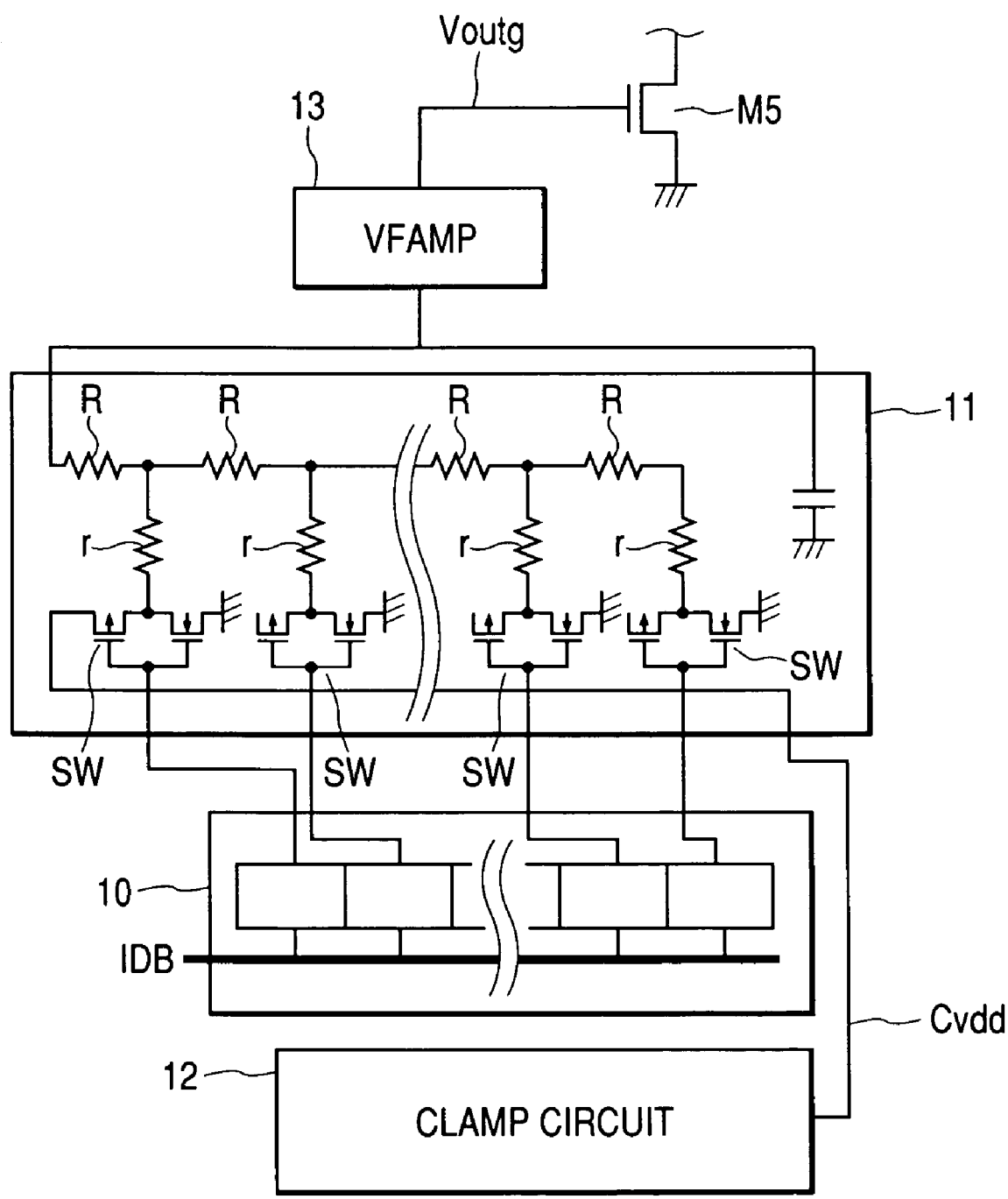
FIG. 11 is a block diagram illustrating a circuit for trimming a gate bias voltage of a constant current source MOS transistor.

A circuit for trimming a gate voltage Voutg is illustrated in FIG. 11. Trimming data is loaded into a data register 10 through a data signal line IDB. The trimming data loaded into the data register 10 is supplied to a digital-to-analog converter (D/A converter) 11. The D/A converter 11 generates a gate bias voltage Voutg corresponding to the trimming data with a clamp voltage Cvdd generated by a clamp circuit 12 as a full scale voltage. The clamp circuit 12 generates a reference voltage using the difference between threshold voltages of MOS transistors and effects multiplication on it through the use of a buffer amplifier to thereby form the corresponding clamp voltage Cvdd. The D/A converter 11 has, for example, a resistance network of series resistors R and shunt resistors r and takes a so-called R2R form circuit configuration wherein the clamp voltage Cvdd is applied to one ends of the respective shunt resistors r through CMOS switches SW turned on/off by signals of bits corresponding to the trimming data. The CMOS switches SW are switch-controlled by the corresponding bits of the data register 10. Since the output of the D/A converter 11 is low impedance, the gate bias voltage Voutg is supplied to its corresponding MOS transistor M5 through a voltage follower amplifier (VFAMP) 13.

The trimming data loaded into the trimming data register 10 is stored in a fuse program circuit or an electrically reprogrammable or rewritable non-volatile memory typified by a flash memory. The setting of the trimming data relative to a fuse program can be performed by selective fusion or the like by laser irradiation in a test process of a semiconductor integrated circuit. Timing provided to load the trimming data from the fuse program circuit to the trimming data register may be performed in sync with the reset of the semiconductor integrated circuit. The fuse program circuit may be activated only upon its reset.

Figure 12:
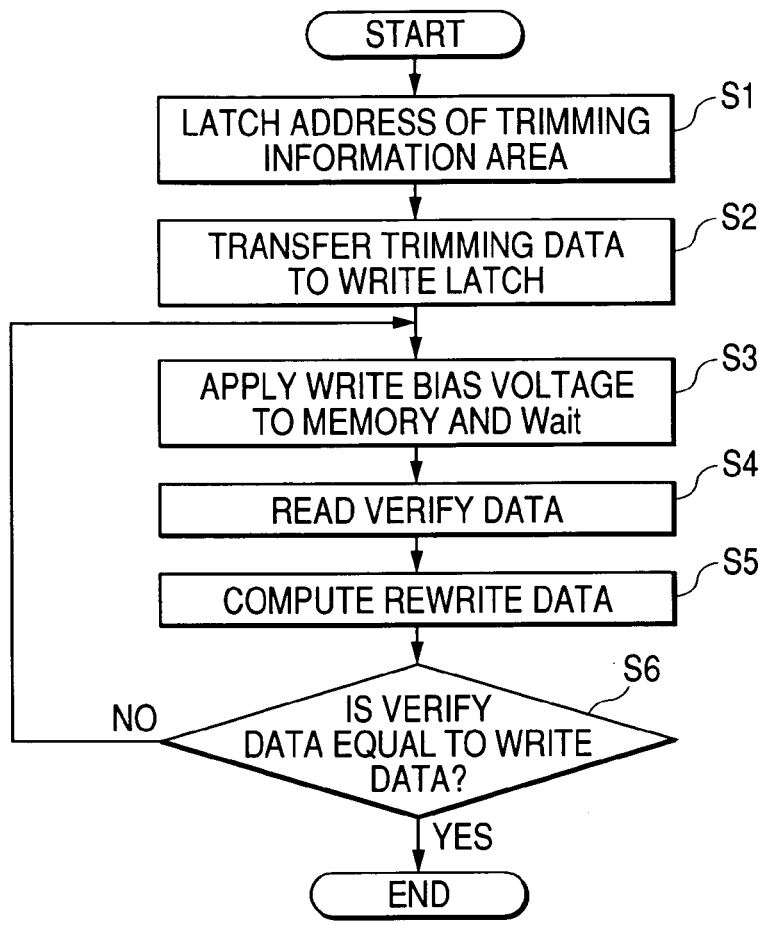
FIG. 12 is a flowchart illustrating a process for writing trimming data into a flash memory.
Figure 13:
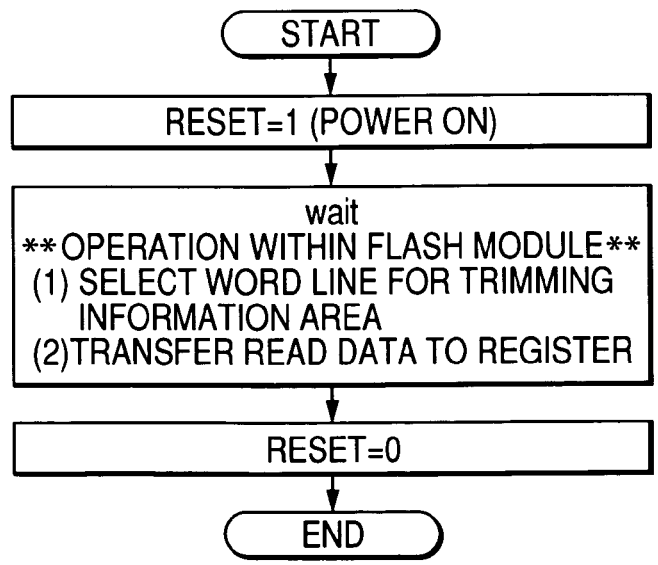
FIG. 13 is a flowchart illustrating a procedure for a read/load process of the trimming data at reset.

On the other hand, the writing of the trimming data into the flash memory may electrically be performed through a tester in the test process or the like. Its write procedure is illustrated in FIG. 12. An address for a trimming information area is latched in an address register (S1), and the trimming data is latched in a write data register (S2). A write voltage is applied to its corresponding address area latched in the address register in accordance with the write data in the data register (S3). Then, verify data is read from the address area (S4), and rewritten data is computed using the read verify data (S5). It is determined whether the verify data coincides with the write data (S6). Steps S3 through S6 are repeated until the coincidence is obtained at this determination. A procedure for a read/load process of the trimming data at reset is shown in FIG. 13. When power-on reset is instructed, a word line for the trimming information area of the flash memory is selected, and the trimming data is transferred from the trimming information area to the trimming data register. This processing is completed during a period up to the release of reset. The setting of the trimming data may be performed on power reset.

Figure 14:
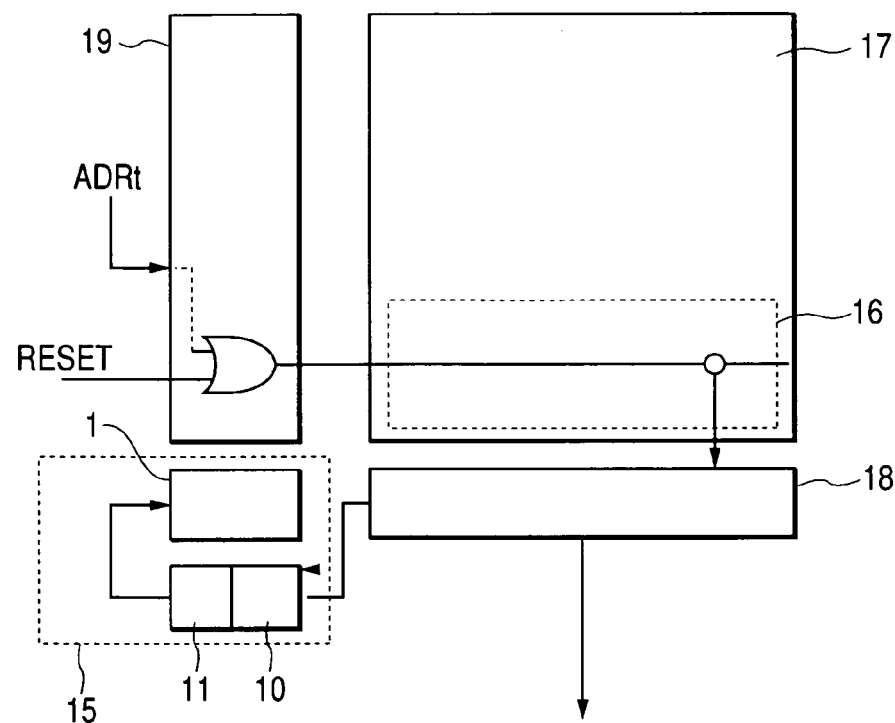
FIG. 14 is a block diagram illustrating a configuration which causes a flash memory equipped with a delay circuit to hold trimming data and makes it available.

The delay circuit 1 and the trimming data register 10 may be part of the flash memory or a functional module different from the flash memory. When the delay circuit 1 is used in a timing control circuit (timing generating circuit) 15 or the like of the flash memory as illustrated in FIG. 14, a trimming data area 16 may be assigned to a predetermined memory area of a flash memory array 17. Trimming data selected and read at the trimming data area 16 is amplified by an amplifier 18, followed by being loaded into the trimming data register 10. The selection of a word line in the trimming area by an address decoder 19 is enabled in response to instructions for a reset operation based on a reset signal RESET, or by the supply of an address signal ADRt for selecting the trimming area in a predetermined operation mode such as trimming data writing or the like to the trimming data area.

Figure 15:
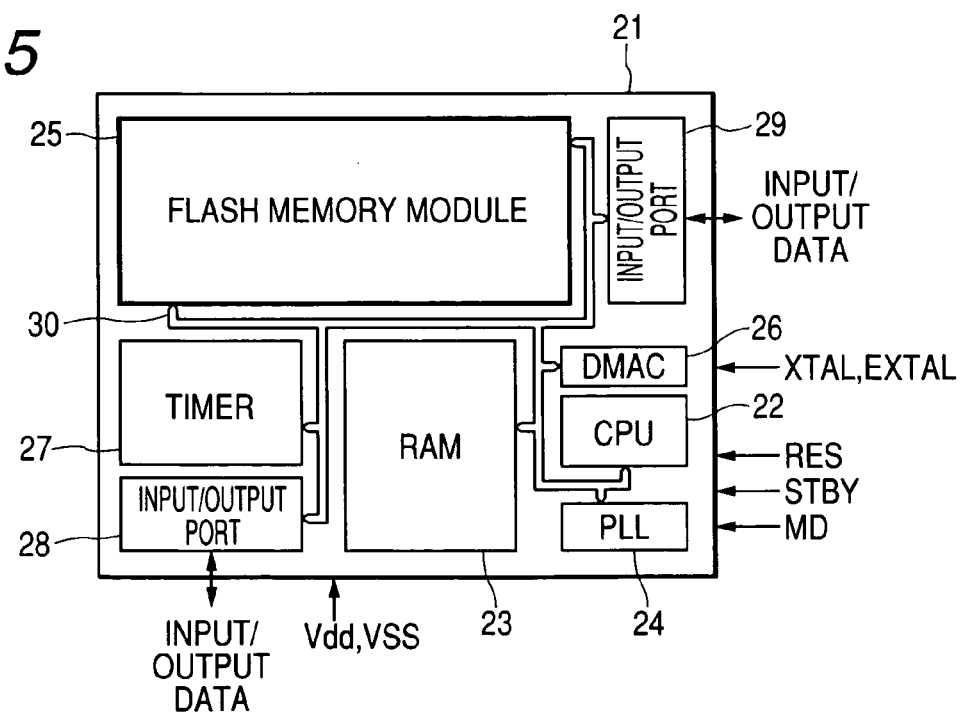
FIG. 15 is a block diagram showing a microcomputer illustrative of one example of a semiconductor integrated circuit according to the present invention.

A single chip microcomputer also called a data processor or a microprocessor or the like illustrative of one example of a semiconductor integrated circuit according to the present invention is illustrated in FIG. 15.

Although not restricted in particular, the microcomputer 21 shown in the same figure is formed over one semiconductor substrate (chip) like monocrystalline silicon by the known semiconductor integrated circuit manufacturing technology.

The microcomputer 21 includes a central processing unit (also called CPU) 22, a random access memory (also called RAM) 23 employed in a work area or the like of the CPU 22, a phase locked loop circuit (also called PLL) 24 which generates an operation reference clock signal or the like, a flash memory module 25, a direct memory access controller (also called DMAC) 26, a timer 27 and input/output ports 28 and 29. Although not restricted in particular, the flash memory module 25 stores operation programs or data of the CPU 22 therein. Those circuits are connected to one another by an internal bus 30. Although not restricted in particular, a bus-master for the internal bus 30 and an external bus belongs to the CPU 22 or DMAC 26. In a state in which the microcomputer 21 is being mounted to a system, the CPU 22 effects erasure and writing on the flash memory module 25. Upon a device test or at a manufacturing stage, an external write device is capable of directly controlling erasure and writing on the flash memory module 25 through the ports 28 and 29. External power supplies of the microcomputer 21 are configured as a power supply voltage Vdd and a circuit ground voltage VSS. A crystal oscillator or the like is connected to external terminals XTAL and EXTAL. An original oscillation signal generated thereby is divided by the PLL 24, which in turn is used as an internal reference clock signal. A standby signal STBY, a reset signal RES and a mode signal MD or the like are inputted as external control signals. After power-on, the interior of the microcomputer 21 is initialized during a low level of the reset signal RES. When reset is released by a high level of the reset signal RES, the CPU 22 starts execution of a program in a program area designated by a vector at an address 0 or the like.

Figure 16:
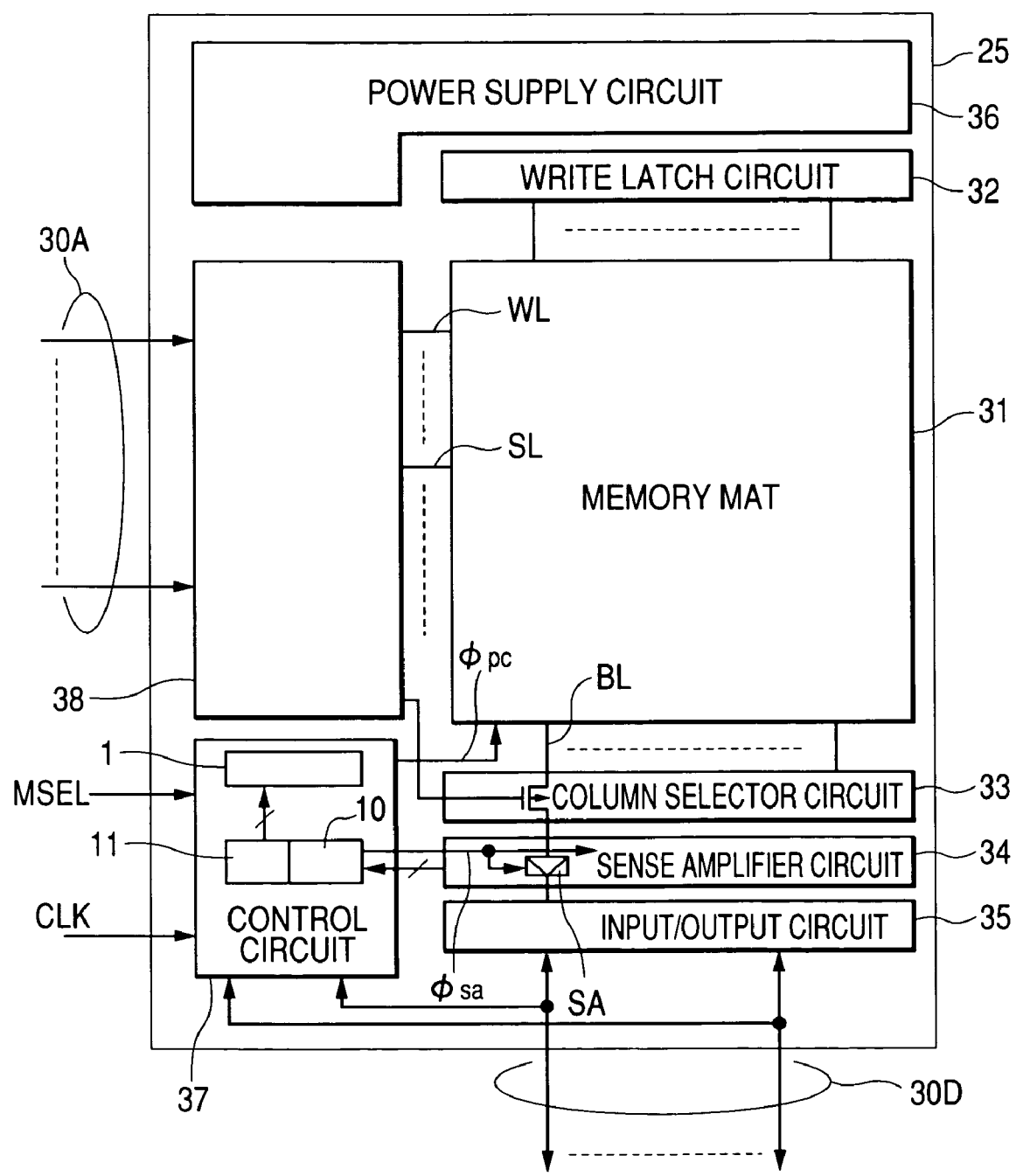
FIG. 16 is a block diagram depicting a flash memory module mounted in the microcomputer.

A block diagram of the flash memory module 25 is illustrated in FIG. 16. The flash memory module 25 has a memory mat 31 wherein a large number of non-volatile memory cells are arranged in matrix form. Selection terminals of the non-volatile memory cells are connected to their corresponding word lines WL or the like. Data terminals of the non-volatile memory cells are connected to their corresponding bit lines BL and source lines SL or the like. A write latch circuit 32 employed in data writing in units of the word lines WL is connected to the bit lines BL. A column selector circuit 33 selects corresponding bit lines in accordance with external input/output units of data. Data read from the bit line BL selected by the column selector circuit 33 is amplified by a sense amplifier circuit 34, which in turn is outputted to the outside from an input/output circuit 35. Write data sent from outside is latched in the write latch circuit 32 through the bit line BL selected by the column selector circuit 33, so that wiring into the corresponding non-volatile memory cell is performed in the word line units. Erasure is performed in units of a predetermined number of word lines, for example. A power circuit 36 generates high voltages necessary for writing and erasure. A timing control circuit (timing generator) 37 controls write, erase and read operations in sync with a clock CLK. Although not restricted in particular, instructions for processing are given in the form of commands from the CPU 22 through an internal data bus 30D. The timing control circuit 37 interprets the commands and gives operation control signals to the respective parts. A decoder/driver circuit 38 used as a logic circuit controls the selection and driving of each word line WL or the like and the operation of selection of the column selector circuit 33 in accordance with the read, erase or write operation. Which word line WL should be selected in those selecting operations is instructed by an address signal supplied through an internal address bus 30A. Incidentally, the address bus 30A and the data bus 30D are included in the internal bus 30.

In the present example, the delay circuit 1 is used to generate an activation control signal (sense amplifier start signal) $\phi$sa or the like for a plurality of sense amplifiers SA that constitute the sense amplifier circuit 34. The delay time set by the delay circuit 1 is defined as a delay time required to obtain delay timing necessary from a change in clock signal CLK to a change in sense amplifier start signal $\phi$sa. Initial loading of trimming data into a data register 10 is performed in response to power-on reset or the like in like manner as described in FIG. 14.

Figure 17:
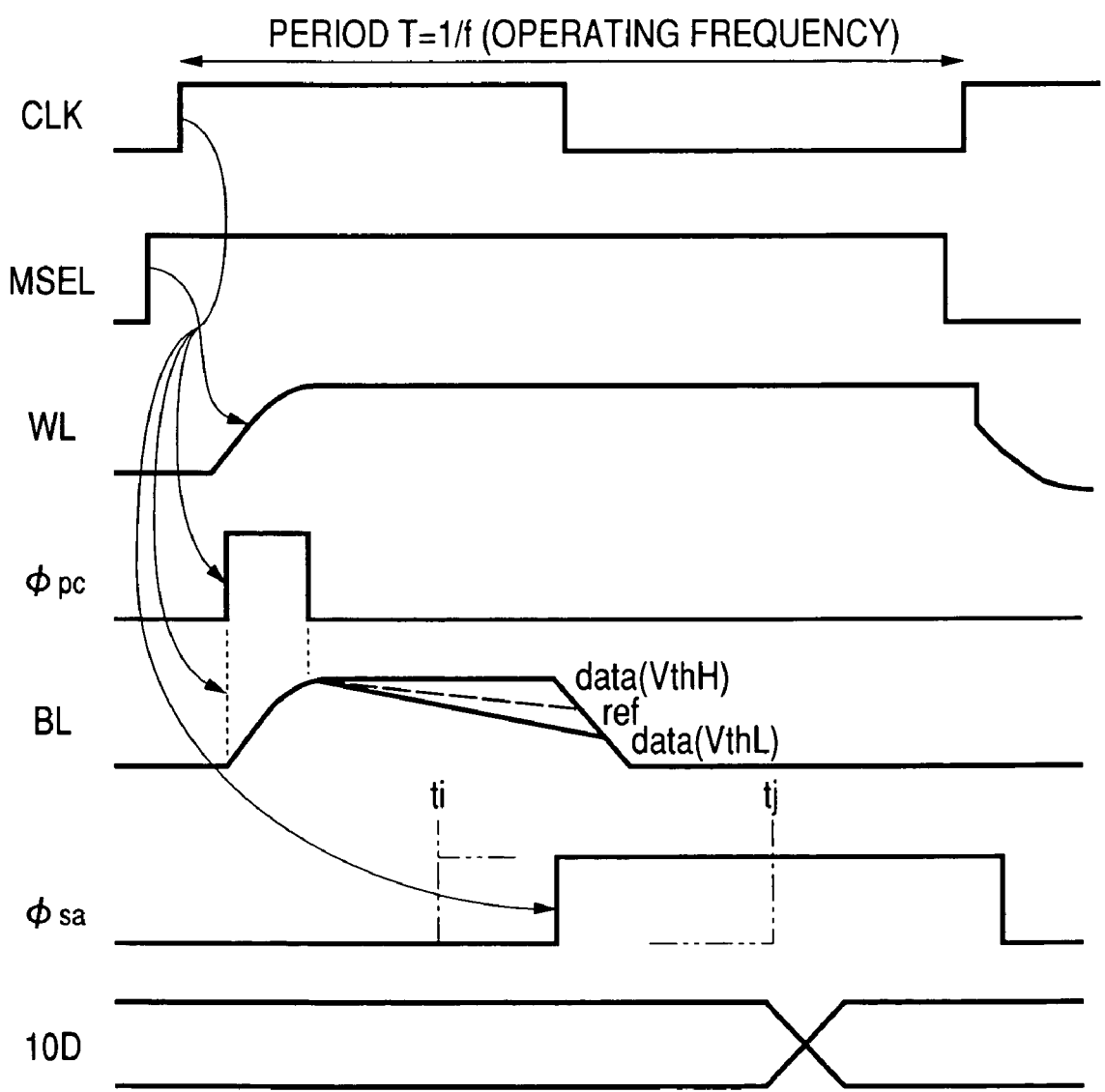
FIG. 17 is a timing chart illustrating read operating timings of the flash memory module.

Read operation timings of the flash memory module 25 are illustrated in FIG. 17. When the operation of the flash memory module 25 is selected in accordance with a module select signal MSEL, the flash memory module 25 selects a corresponding word line WL in sync with the rising edge of the clock CLK and performs precharge of its corresponding bit line BL by a precharge signal $\phi$pc. The timing provided to raise a sense amplifier start signal $\phi$sa relative to the rising edge of the clock signal CLK is determined using the delay time of the delay circuit. That is, the delay circuit 1 inputs or receives the clock signal CLK as a signal IN following the rising edge of the module select signal MSEL. The control circuit 37 brings the sense amplifier start signal $\phi$sa to an enable level corresponding to a high level in sync with the rising edge of an output signal OUT of the delay circuit 1 during a predetermined period. Thus, the activated sense amplifier amplifies the potential of the bit line BL with respect to a reference potential ref and outputs read data corresponding to the result of amplification to the data bus 30D.

As described above, the delay circuit 1 suppresses low the variation in delay characteristic due to the variation in power supply voltage, the variation in temperature and the process variations. Thus, there are no produced an event that the delay set by the delay circuit 1 becomes insufficient so that the timing provided to activate the sense amplifier becomes excessively early, whereby a margin sufficient for a sense operation (for timing of ti) cannot be ensured, and an event that the delay set by the delay circuit 1 becomes excessively large so that the timing provided to activate the sense amplifier becomes excessively slow, whereby a read operation speed (at a time tj) is reduced. Thus, since the operation speed for data reading becomes constant with a high degree of accuracy, this can contribute to high performance and speeding up of a memory. Further, the delay circuit 1 needs not provide a divider, a phase comparator and a charge pump in order to suppress variations in delay characteristic, and is not increased in its area. Since there is no need to generate a standard clock through the use of external parts such as a crystal oscillator for suppressing the variations in delay characteristic, the number of circuit's parts does not increase either.

Figure 18:
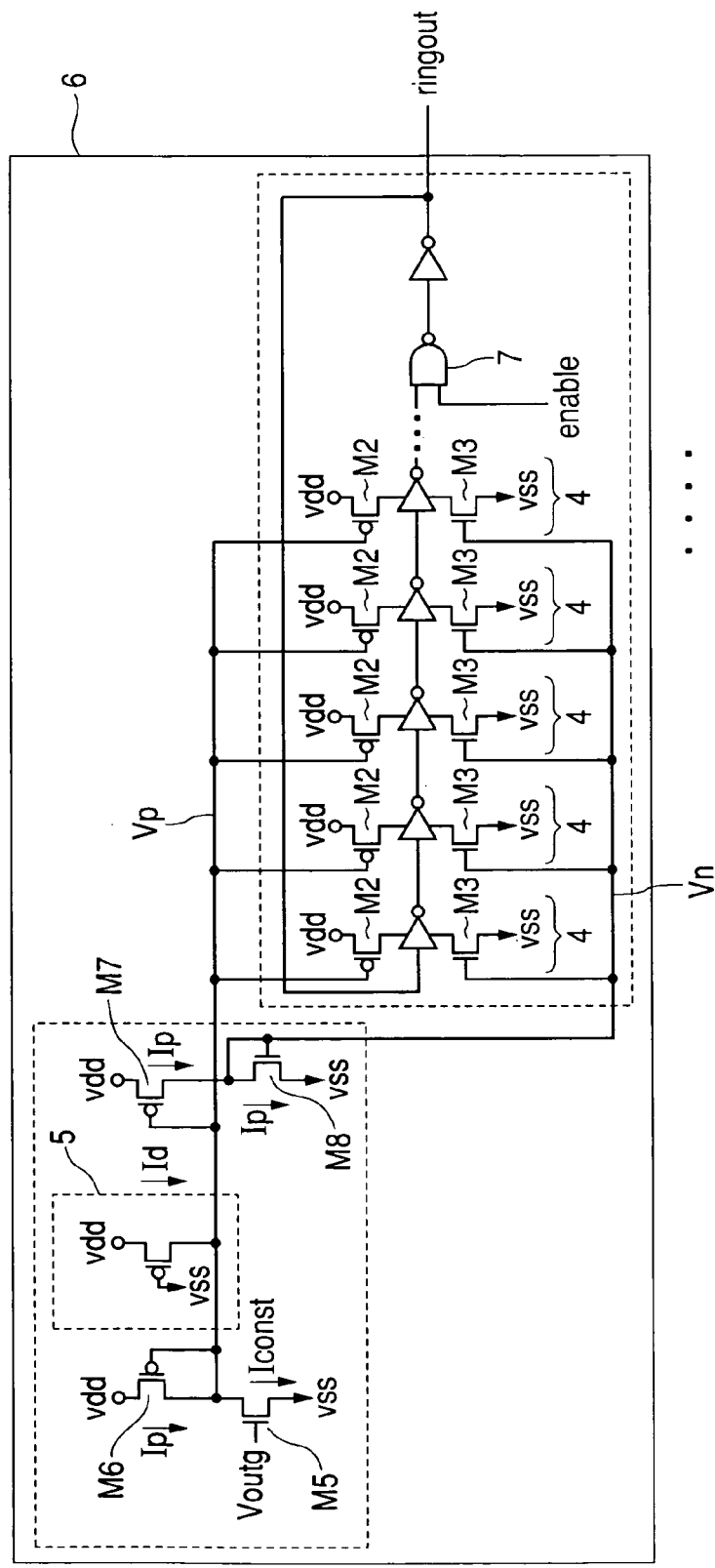
FIG. 18 is a circuit diagram showing a delay circuit configured as a ring oscillator.
Figure 19:
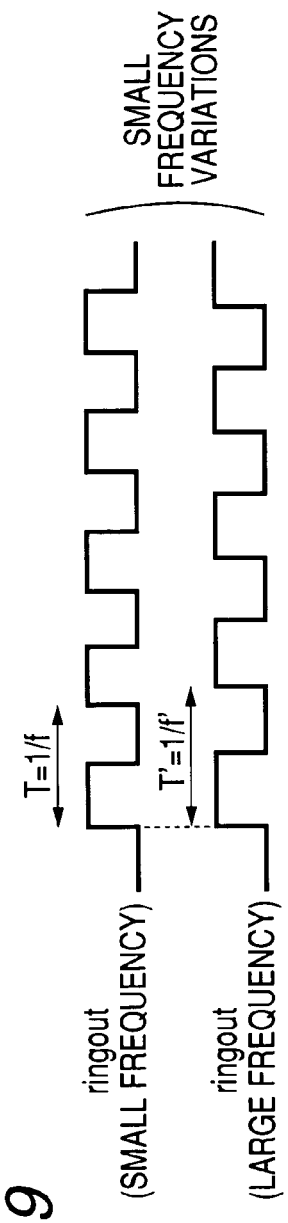
FIG. 19 is a timing chart illustrating a speed-best state (large frequency) of an oscillation frequency produced from the ring oscillator shown in FIG. 18 and a speed-worst state (small frequency) thereof.

An example wherein a delay circuit is configured as a ring oscillator 6, is shown in FIG. 18. The present example is different from FIG. 1 in that a plurality of CMOS inverter type circuits 4 are feedback-connected at the delay stage 2 to configure an oscillation stage. An AND gate 7 is provided for controlling start/stop of an oscillating operation. Symbol enable indicates an oscillation enable signal and enables the oscillating operation at a high level. A delay controller 3 serves so as to suppress variations in oscillating characteristic due to a variation in power supply voltage, a variation in temperature and process variations, i.e., a variation in frequency. Since the operating current of each of the CMOS inverter type circuits 4 is controlled using a current Ip that compensates for dependence on the variation in power supply voltage, the variation in temperature and the process variations (variation in threshold voltage), an unillustrated circuit operated in sync with a clock signal Ringout generated by the oscillator 6 is capable of reducing the difference in operating speed between a speed best state (large frequency) and a speed worst state (small frequency) as illustrated in FIG. 19 by way of example. Thus, since the frequency of the clock signal generated inside can be kept constant with high accuracy if the present invention is configured as the ring oscillator 6, the circuit operated in sync with such a clock signal can be brought to high performance.

While the invention made above by the present inventors has been described specifically based on the embodiments, the present invention is not limited to the same. It is needless to say that various changes can be made thereto within the scope not departing from the gist thereof.

The delay circuit can be applied not only to, for example, the use thereof in the generation of the sense amplifier activation signal of the memory but also to the generation of other timing control signals of the memory and the generation of control signals of various logical integrated circuits other than the memory. The memory to which the present invention is applied, is not limited to the rewritable non-volatile memory typified by the flash memory. The present invention can be applied even to a random access memory, a mask ROM, etc. Further, the flash memory is not limited to the flash memory module on-chipped to the microcomputer. The present invention can obviously be applied even to a discrete flash memory chip. The present invention is not limited to the CMOS circuit. A MOS inverter type using a saturation load may be adopted. The delay stage may be configured using bipolar transistors. The compensating circuit may change its compensating element according to the circuit elements constituting the delay stage. The trimming data is not limited to such a configuration that it is held in the memory having the delay circuit. In response to the reset instructions, the trimming data may be initially loaded from the flash memory retaining the trimming data to the random access memory or the like.

What is claimed is:

1. A semiconductor integrated circuit comprising:
a delay circuit having
a constant current source, a delay stage, and a compensating circuit; and
a load transistor connected in parallel with the compensating circuit at a constant current node of the constant current source,
wherein said delay stage determines an operation delay time of an output relative to an input depending on a constant current produced by the constant current source and said delay stage comprises inverter type circuits including a plurality of first transistors each having a mutual conductance determined by the constant current produced by the constant current source, and a plurality of second transistors switched in response to the input and arranged in series with the plurality of first transistors, and
wherein a current that flows through the load transistor is mirror-reflected on the plurality of first transistors,
wherein said compensating circuit compensates for a variation in delay characteristic of the delay stage due to at least one of a variation in temperature, a variation in power supply voltage, and a process variation.

2. A semiconductor integrated circuit comprising:
a delay circuit having a constant current source, a delay stage, and a compensating circuit; and
a load MOS transistor connected in parallel with the compensating circuit at a constant current node of the constant current source,
wherein said delay stage determines an operation delay time of an output relative to an input depending on a constant current produced by the constant current source and said delay stage comprises complementary MOS inverter type circuits including a first plurality of transistors each having a mutual conductance determined by the constant current produced by the constant current source, and a second plurality of transistors switched in response to the input signal and arranged in series with the first plurality of transistors, and
wherein a current that flows through the load transistor is mirror-reflected on the first plurality of transistors which are the same conduction type as the load MOS transistor,
wherein said compensating circuit compensates for a variation in delay characteristic of the delay stage due to at least one of a variation in temperature, a variation in power supply voltage, and a process variation,
wherein the first plurality of transistors includes p channel type current control MOS transistors and n channel type current control MOS transistors, and the second plurality of transistors includes p channel type switching MOS transistors and n channel type switching MOS transistors.

3. The semiconductor integrated circuit according to claim 2, wherein the compensating circuit has a compensating element connected to the constant current node of the constant current source, and the compensating element is one MOS transistor identical in size to current control MOS transistors of one conduction type in each of the complementary MOS inverter type circuits.

4. The semiconductor integrated circuit according to claim 2, wherein the compensating circuit has a compensating element connected to the constant current node of the constant source, and the compensating element is a MOS transistors equivalently smaller in size than the current control MOS transistors of one conduction type in the complementary MOS inverter type circuitse.

5. The semiconductor integrated circuit according to claim 4, wherein the equivalently small-sized MOS transistors are equivalent to MOS transistors connected in series in plural form, which are identical in size to the current control MOS transistors of one conduction type in the complementary MOS inverter type circuits.

6. The semiconductor integrated circuit according to claim 2, wherein the compensating circuit comprises a current mirror circuit which supplies a mirror current to the constant current node of the constant current source, and the current mirror circuit comprises p channel type MOS transistors identical in size to the p channel type current control MOS transistors in the complementary MOS inverter type circuits, and an n channel type MOS transistor identical in size to the n channel type current control MOS transistors in the complementary MOS inverter type circuits.

7. The semiconductor integrated circuit according to claim 6, wherein the delay circuit is configured as a timing generator which delays the input at the delay stage to output a timing signal.

8. The semiconductor integrated circuit according to claim 7, further comprising a memory equipped with the delay circuit, wherein the memory performs a read operation using the timing signal generated by the delay circuit.

9. The semiconductor integrated circuit according to claim 7, further including a logic circuit which controls access to the memory.

10. The semiconductor integrated circuit according to claim 6, wherein the delay circuit is configured as a ring oscillator which feeds back the output of the delay stage to the input thereof to generate a clock.

11. A semiconductor integrated circuit comprising:
a delay circuit having a constant current source, a delay stage, and a compensating circuit;
a load transistor connected in parallel with the compensating circuit at a constant current node of the constant current source; and
a trimming register which loads trimming data therein, and a digital-to-analog converter which digital/analog-converts the trimming data loaded into the trimming register,
wherein the constant current source has a MOS transistor of which the gate-to-source voltage is set in such a manner that a difference in current between the drain and source due to a difference in temperature becomes small,
wherein a voltage outputted from the digital-to-analog converter defines a gate voltage to be applied to the MOS transistor of the constant current source, wherein said delay stage determines an operation delay time of an output relative to an input depending on a constant current produced by the constant current source and said delay stage comprises inverter type circuits including a first plurality of transistors each having a mutual conductance determined by the constant current produced by the constant current source, and a second plurality of transistors switched in response to the input signal and arranged in series with the first plurality of transistors, wherein a current that flows through the load transistor is mirror-reflected on the first plurality of transistors, and wherein said compensating circuit compensates for a variation in delay characteristic of the delay stage due to at least one of a variation in temperature, a variation in power supply voltage, and a process variation.

12. The semiconductor integrated circuit according to claim 11, further comprising a non-volatile memory area which holds trimming data, and a control circuit which reads the trimming data from the non-volatile memory area in response to a reset and loads the trimming data into the trimming register.

* * * * *